United States Patent [19]

Wong et al.

[11] Patent Number: 4,987,324
[45] Date of Patent: Jan. 22, 1991

[54] HIGH-SPEED CMOS BUFFER WITH CONTROLLED SLEW RATE

[75] Inventors: Anthony Y. Wong, Cupertino; Robert M. Walker, III, Atherton, both of Calif.

[73] Assignee: LSI Logic Corporation, Milpitas, Calif.

[21] Appl. No.: 90,273

[22] Filed: Aug. 27, 1987

Related U.S. Application Data

[63] Continuation of Ser. No. 725,463, Apr. 22, 1985, abandoned.

[51] Int. Cl.[5] .................. H03K 19/094; H03K 17/16; H03K 3/01; H03K 17/687
[52] U.S. Cl. ..................................... 307/451; 307/443; 307/448; 307/270; 307/585

[56] References Cited

U.S. PATENT DOCUMENTS 3,631,528  12/1971  Green ................................. 307/288
4,103,188   7/1978  Morton ............................... 307/255

Primary Examiner—Stanley D. Miller
Assistant Examiner—Margaret Rose Wambach
Attorney, Agent, or Firm—Skjerven, Morrill, MacPherson, Franklin & Friel

[57] ABSTRACT

A high-speed CMOS output buffer reduces transient current surges and provides high output DC drive. The buffer includes a first and a second CMOS inverter connected in parallel. Each of the two CMOS inverters includes an N channel and a P channel transistor. The gates of the transistors in the first inverter are controlled by a first control inverter having a first selected switching threshold voltage. The gate of the P channel transistor in the second inverter is controlled by a second control inverter having a switching threshold voltage higher than that of the first control inverter. The gate of the N channel transistor in the second inverter is controlled by a third control inverter having a switching threshold voltage lower than that of the first control inverter.

9 Claims, 3 Drawing Sheets

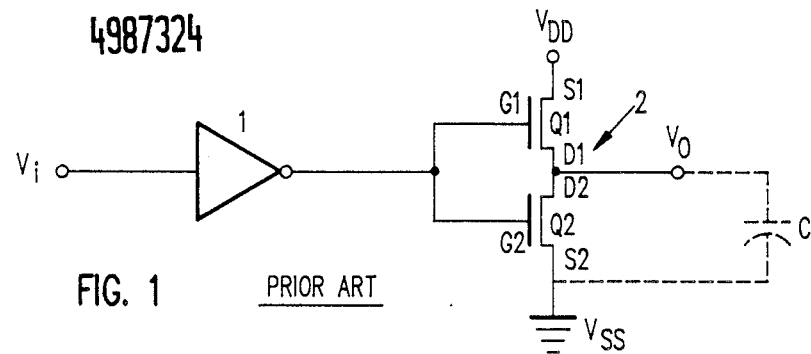
FIG. 1 PRIOR ART
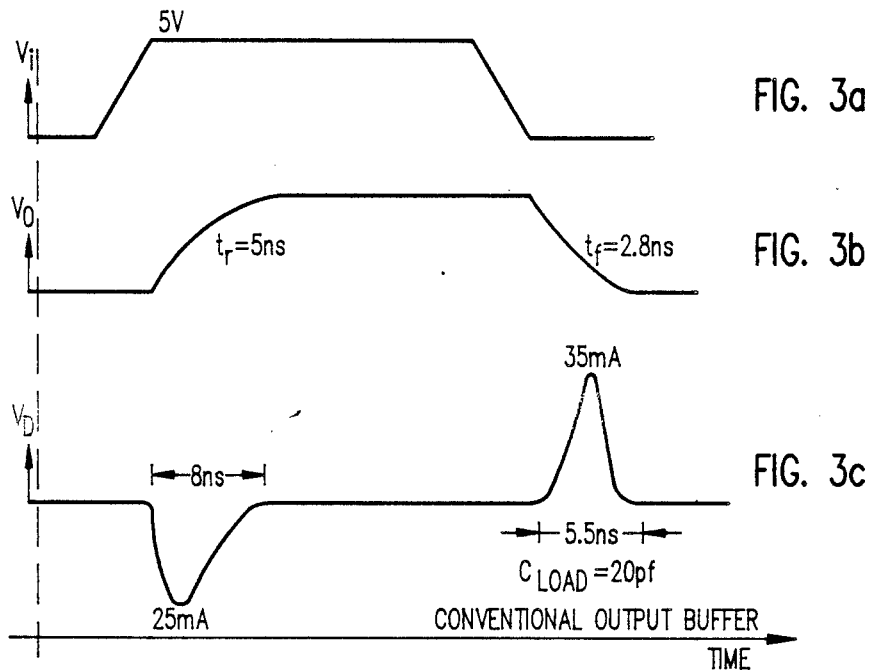
FIG. 3a
FIG. 3b
FIG. 3c
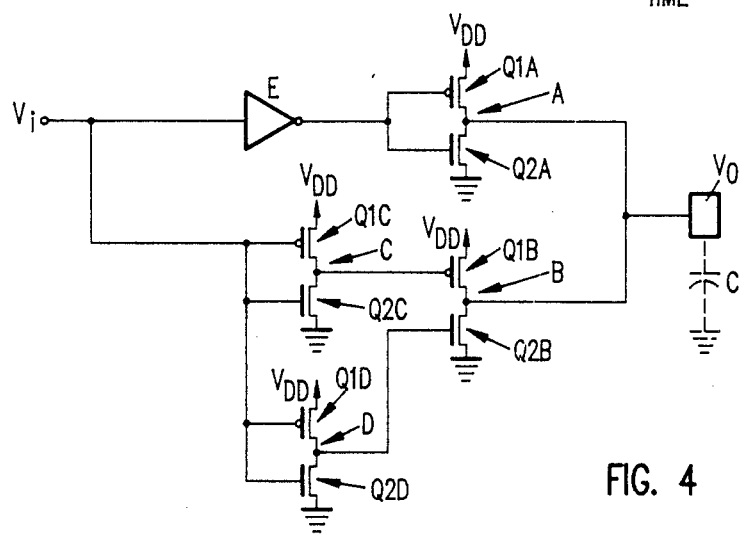
FIG. 4

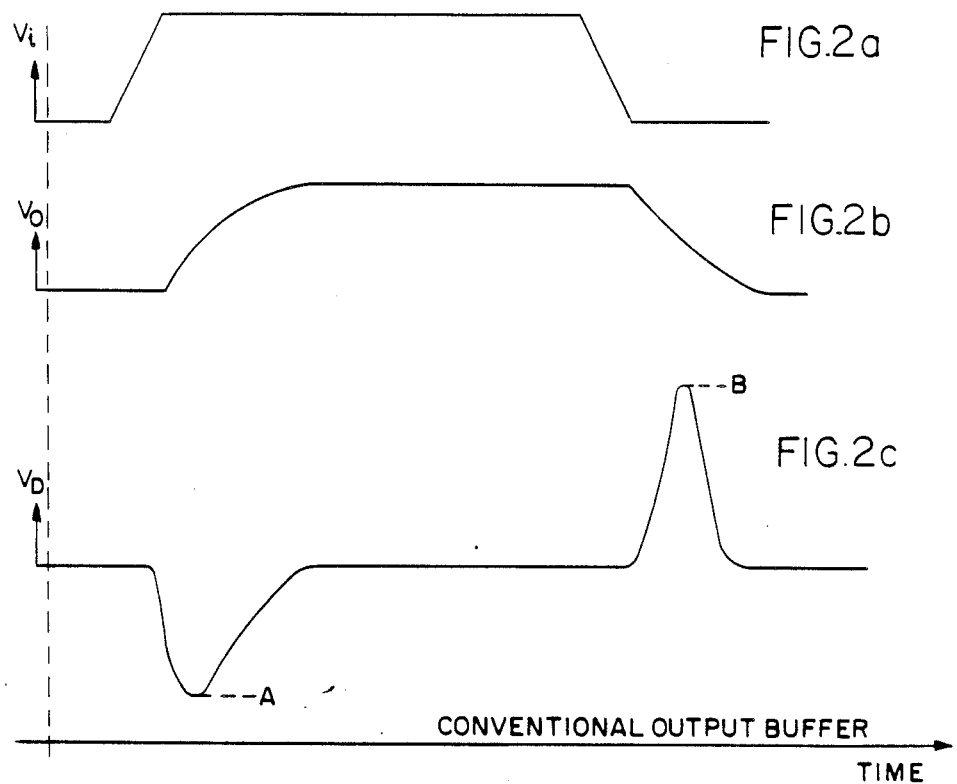

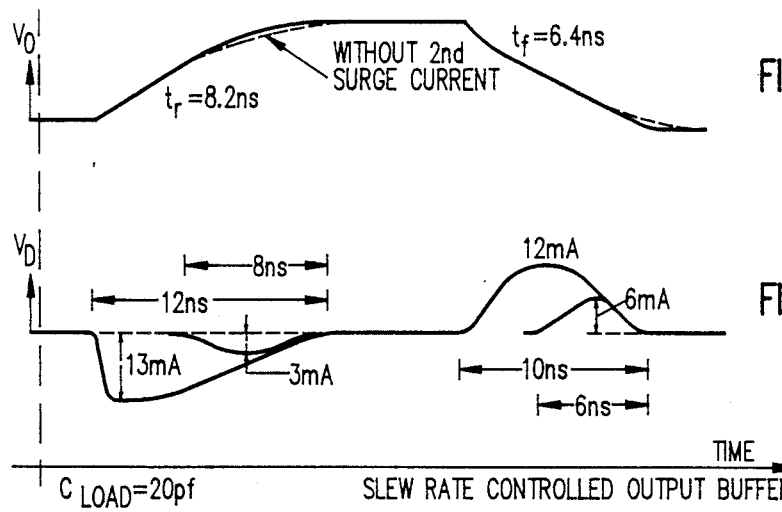
FIG. 5a
FIG. 5b
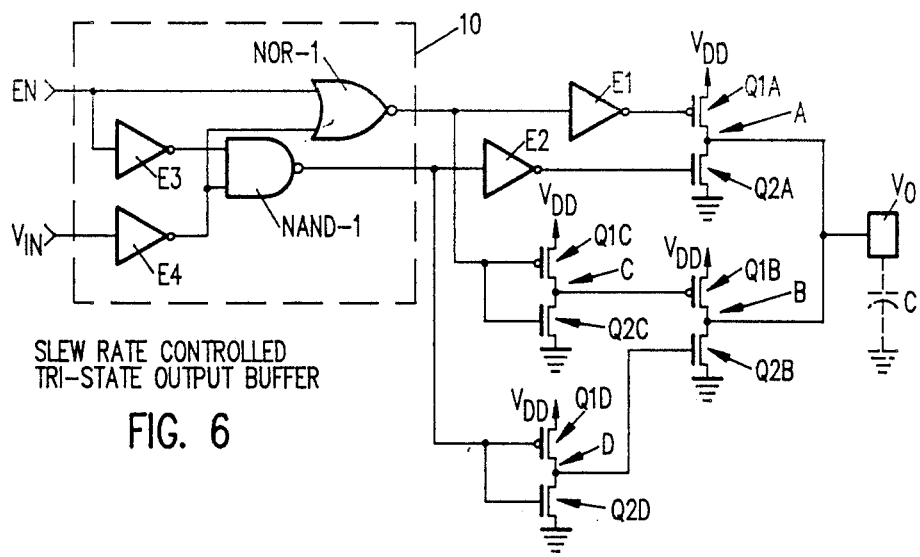
FIG. 6
| EN | V$_i$ | NOR-1 | NAND-1 |
|----|----|-------|--------|
| 0  | 0  | 0     | 0      |
| 0  | 1  | 1     | 1      |
| 1  | 0  | 0     | 1      |
| 1  | 1  | 0     | 1      |
FIG. 7

HIGH-SPEED CMOS BUFFER WITH CONTROLLED SLEW RATE

CROSS-REFERENCE TO RELATED APPLICATION

This application is a continuation of pending patent application Ser. No. 06/725,463 filed Apr. 22, 1985, now abandoned.

BACKGROUND OF THE INVENTION

1. Field of the Invention

This invention relates to a high-speed CMOS output buffer and in particular to a high speed CMOS output buffer with a controlled slew rate.

2. Description of the Prior Art

CMOS buffers are used to drive the input of CMOS circuits directly or through a bus line. The buffers function as an isolating circuit that prevents a driven circuit from influencing the driving circuit. The signal output of the buffer needs to be free of noise signal, cross-talk, and any undesirable interfering signals.

Prior art CMOS output buffers are known to exhibit very fast output voltage transitions. In an integrated circuit, this rapid rate of change of the output voltage ($dV_o/dt$) of a CMOS output buffer causes large power supply current surges, cross-talk, i.e., undesired energy appearing in one signal path as a result of coupling from other signal paths, ringing, and other undesirable system effects. These effects are magnified in high pin count packages, i.e., packages with more than 100 output pins.

In normal application, there is always a capacitive load C, as shown in FIG. 1 for example. Transient current surges occur during periods when the output voltage is rising and falling. The larger the capacitor, the greater is the noise problem. Capacitors of 100–300 picoFarads are frequently used in CMOS buffer circuits and surge currents occur with resultant increased noise effects.

For example, in U.S. Pat. No. 3,631,528 a buffer circuit is described wherein a high capacitive load is driven, the circuit dissipates very little power internally, but the power dissipation contributed by the capacitive load is substantial. The inverter stages of the patented buffer circuit are small so that current and power used in those stages are reduced during switching. The buffer circuit has rise and fall times that are relatively fast, and the surge current is very high. The high surge current that appears at the output of the load capacitor generates undesirable noise. The larger the capacitor, the higher is the current surge and as a result there is increased noise signal.

SUMMARY OF THE INVENTION

An object of this invention is to provide a high-speed CMOS output buffer which substantially reduces transient current surges due to the capacitive loading charge and discharge during switching, but which does not reduce the DC output drive of the buffer.

Another object of this invention is to provide a high-speed CMOS output buffer wherein a relatively large load capacitor is used with minimal noise during switching.

In accordance with this invention a high-speed CMOS output buffer comprises a first circuit network having a first control inverter and a first output inverter, and a second circuit network having a second output inverter and second and third control inverters. The two circuit network are connected in parallel.

The threshold voltage of the first control inverter is less than that of the second control inverter and greater than that of the third control inverter.

During operation of the output buffer, an input signal having rising and falling portions is applied to the three control inverters. During the rise time of the input signal, a load capacitor which is connected to the output inverters is first slowly and partially charged by the "weaker" first circuit network and then rapidly charged by the "stronger" second circuit network. When the input signal switches from the rising portion to the falling portion, the load capacitor is discharged slowly and partially by the first circuit network and then rapidly discharged by the second circuit network. In this way, transient surge currents with resultant noise are effectively minimized. The surge currents produced by the switching of the first and second output inverters are less than the surge current that would be produced by the switching of a single CMOS output buffer having equivalent DC drive.

BRIEF DESCRIPTION OF THE DRAWINGS

FIG. 1 is a schematic diagram of a prior art CMOS output buffer;

FIG. 2a is a voltage input curve for the buffer of FIG. 1;

FIG. 2b is a voltage output curve for the buffer of FIG. 1 corresponding to the input curve of FIG. 2a;

FIG. 2c is a waveform representing the current ID corresponding to the curves shown in FIG. 2a and FIG. 2b;

FIGS. 3a, 3b and 3c respectively illustrate a voltage input curve, a corresponding voltage output curve and an ID current waveform for specific values of component parameters for the circuit shown in FIG. 1;

FIG. 4 is a schematic circuit diagram of an embodiment of the present invention;

FIG. 5a is a voltage output curve and FIG. 5b is a waveform corresponding to the input voltage curve shown in FIG. 3a for the embodiment of the invention shown in FIG. 4;

FIG. 6 is a schematic circuit of a tri-state embodiment of the present invention; and FIG. 7 shows a truth table for the control logic 10 of FIG. 6.

DETAILED DESCRIPTION

FIG. 1 shows a prior art CMOS output buffer circuit comprising inverters 1 and 2. The input voltage signal is supplied to input lead $V_i$ connected to inverter 1. The output signal of inverter 1 is applied to the gates G1 and G2 of transistors Q1 and Q2, respectively, of inverter 2. Transistor Q1 is a P channel enhancement mode transistor, and transistor Q2 is an N channel enhancement mode transistor. Source S1 of transistor Q1 is connected to the supply voltage $V_{DD}$. Drain D1 of transistor Q1 is connected to drain D2 of transistor Q2 and both are connected to output node $V_o$ of inverter 2. Source S2 of transistor Q2 is connected to system ground $V_{SS}$. Capacitor C, shown schematically in FIG. 1 connected between $V_o$ and system qround, represents the load capacitor.

FIGS. 2a and 2b respectively show typical input and output voltage curves for the output buffer of FIG. 1. FIG. 2c represents the current $I_D$ supplied to load capacitor C. There is a transient current surge during the period while $V_o$ is rising. During this switching interval, power is dissipated in the channel resistance of P channel transistor Q1 and energy is supplied to the load capacitor C. Similarly, there is a transient current surge during the period while the voltage $V_o$ is falling. During this period the energy stored in the load capacitor C is dissipated in the channel resistance of N channel transistor Q2. If the capacitance of load capacitor C is increased, the rise time and the fall time increase and the peak values A and B of the transient currents also increase in absolute value.

As stated above, these transient current surges are undesirable. Attempts have been made to reduce these transient current surges by using conventional negative feedback techniques to reduce the time rate of change of the output voltage $dV_o/dt$, but unacceptable delays are introduced using this approach. Of course, reducing the size of transistors Q1 and Q2 in inverter 1 reduces the transient currents, but this also reduces DC drive to unacceptable levels.

With reference to FIGS. 3a, 3b and 3c, the input voltage waveform $V_i$, the output voltage waveform $V_o$ and the current waveform $I_D$, respectively, are applicable to the prior art output buffer circuit shown in FIG. 1 under the following assumptions:
  (1) Transistor Q1 comprises 11 transistors connected in parallel, each transistor having a channel width of 66 microns, so that the channel width of Q1 is $11 \times 66$ microns; and the channel length of Q1 is 3 microns
  (2) Transistor Q2 comprises 8 transistors connected in parallel, each transistor having a channel width of 58 microns, so that the channel width of Q2 is $8 \times 58$ microns; and the channel length of Q2 is 2.5 microns
  (3) The supply voltage $V_{DD} = 5$ volts; and
  (4) The load capacitance is 20 picoFarads.

Under the above assumptions, the rise time $t_r$ is approximately 5 nanoseconds (See FIG. 3b) and the corresponding current surge in $I_D$ reaches a peak of approximately 25 milliamps (see FIG. 3c). The fall time $t_f$ is approximately 2.8 nanoseconds and the corresponding current surge in $I_D$ reaches a peak of 35 milliamps.

FIG. 4 shows one embodiment of the CMOS output buffer of the present invention which has the same total output drive as the CMOS buffer circuit shown in FIG. 1 where P channel transistor Q1 and N channel transistor Q2 satisfy assumptions (1) and (2) above.

In an implementation of the CMOS buffer circuit shown in FIG. 4, inverters A and B are connected in parallel. Inverter A consists of P channel enhancement mode transistor Q1A and N channel enhancement mode transistor Q2A. Transistor Q1A has a channel width of $4 \times 66$ microns and a channel length of 3 microns. Transistor Q2A has a channel width of $2 \times 58$ microns and a channel length of 2.5 microns. Inverter B consists of P channel enhancement mode transistor Q1B and N channel enhancement mode transistor Q2B. Transistor Q1B has a channel width of $7 \times 66$ microns and a channel length of 3 microns. Transistor Q2B has a channel width of $6 \times 58$ microns and a channel length of 2.5 microns. The drains of transistors Q1A, Q2A, Q1B and Q2B are all connected to the output node $V_o$. Thus in view of the channel dimensions given above, inverters A and B connected as shown in FIG. 4 have the same DC drive as inverter 1 which satisfies conditions (1) and (2) above. The sources of transistors Q1A and Q1B are connected to the positive power supply $V_{DD}$ which is 5 volts in this embodiment, and the sources of transistors Q2A and Q2B are connected to ground.

The input voltage signal $V_i$ is applied to the gates of transistors Q1A and Q2A via CMOS inverter E which has a switching threshold voltage $V_{SE}$ of approximately 2.5 volts with $V_{DD}$ at 5 volts. The term switching threshold voltage of a CMOS inverter as used in this specification means the input voltage of the inverter at which both the N channel and P channel transistors in the inverter are saturated. Holt, *Electronic Circuits Digital and Analog*, John Wiley & Sons (1978), which is incorporated herein by reference, shows in FIGS. 8-15 on page 239, a voltage transfer characteristic for a CMOS inverter wherein both transistors are saturated when the input voltage is 0.5 $V_{DD}$. Inverter A also has a switching threshold voltage of approximately 2.5 volts. The output voltage signal of inverters A and B appears on output node $V_o$.

The gate of N channel enhancement mode transistor Q2B of inverter B is controlled by the output signal of inverter D. Similarly, the gate of P channel enhancement mode transistor Q1B of inverter B is controlled by the output signal of inverter C.

Inverter D is specially constructed to have a switching threshold voltage of 1.1 volts, which is lower than the switching threshold voltage of inverters A and E. Inverter D comprises P channel enhancement mode transistor Q1D and N channel enhancement mode transistor Q2D. The low switching threshold voltage of inverter D is achieved by making. The gate width of N channel enhancement mode transistor Q2D larger than the gate width of P channel enhancement mode transistor Q1D. For example, in one embodiment, the gate width of transistor Q1D is 9 microns (and the gate length is 2.5 microns), and the gate width of transistor Q2D is 78 microns (and gate length is 2 microns), which produces an inverter D having a switching threshold voltage of 1.1 volts.

Inverter C, which controls the gate of transistor Q1B, is comprised of transistors Q1C and Q2C. Inverter C is specially constructed so that the switching threshold voltage of inverter C is higher than the switching threshold voltage of inverters E and A. This is achieved by making the gate width of P channel enhancement mode transistor Q1C larger than the gate width of N channel enhancement mode transistor Q2C. For example, in one embodiment, the gate width of transistor Q1C is 78 microns (and gate length is 2.5 microns), and the gate width of transistor Q2C is 6 microns (and the gate length is 2 microns), which produces an inverter C having a switching threshold voltage of 3.7 volts with $V_{DD}$ at 5.0 volts.

The operation of the CMOS output buffer shown in FIG. 4 is as follows. Assume as initial conditions that the input voltage $V_i$ is 0 volts, that the output voltage $V_o$ is 0 volts since both Q2A and Q2B are turned on and Q1A and Q1B are turned off, and that the capacitance of the load capacitor, indicated schematically by capacitor C in FIG. 4, is 20 picoFarads. Assume also that the voltage input signal $V_i$ follows the curve shown in FIG. 3a.

As the voltage $V_i$ applied to inverters E, C and D rises, the output signal of inverter D goes low first since inverter D has the lowest switching threshold voltage, namely 1.1 volts. This causes the voltage on the gate of transistor Q2B of inverter B to fall, turning off transistor Q2B. Next, as the voltage $V_i$ continues to rise to 2.5 volts, inverter E goes low, causing the voltage on the gates of transistors Q1A and Q2A to fall which turns on transistor Q1A and turns off transistor Q2A. The transient surge of current through transistor Q1A charges load capacitor C and causes the first surge in the $I_D$ current shown in FIG. 5b. The peak of this current surge has a value of approximately 13 milliamps. The absolute value of this peak current is only approximately one-half of the absolute value of the peak surge current shown in FIG. 3c. The lower peak value of the transient current surge is due to the smaller dimensions of transistor Q1A as compared to the dimensions of transistor Q1 and Q2 set forth in conjunction with FIGS. 3b and 3c.

As the voltage $V_i$ continues to rise and reaches 3.7 volts, inverter C goes low, causing the voltage applied to the gate of P channel enhancement mode transistor Q1B to fall, thus turning on transistor Q1B. As transistor Q1B turns on, there is a second transient surge in ID, namely a surge in current through transistor Q1B which continues to charge load capacitor C. The second current surge has a duration of approximately 8 nanoseconds and a peak value of approximately 3 milliamps as shown in FIG. 5b. The curve representing the output voltage signal $V_o$ is shown in FIG. 5a. The rise time of the output voltage signal $V_o$ is approximately 8.2 nanoseconds compared with the rise time of nanoseconds for the circuit corresponding to FIG. 3b.

As the voltage signal $V_i$ begins to fall (as shown in FIG. 3a), inverter C, having the highest switching threshold voltage (3.7 volts), switches first, causing the voltage applied to the gate of transistor Q1B of inverter B to rise, thus shutting off transistor Q1B. As the voltage signal $V_i$ continues to fall to 2.5 volts, inverter E switches, causing the voltage applied to the gate of transistors Q1A and Q2A to rise, which turns on transistor Q2A and turns off transistor Q1A. The turning on of transistor Q2A causes the current surge in $I_D$ having a peak value of approximately 12 milliamps as shown in FIG. 5b. This current surge dissipates power as the energy stored in the load capacitor C is dissipated in the channel resistance of N channel enhancement mode transistor Q2A of inverter A. As the input voltage $V_i$ falls to 1.1 volts, inverter D switches, causing the voltage applied to the gate of transistor Q2B to rise, turning on transistor Q2B and thus causing a fourth surge of $I_D$ current. This current surge has a maximum value of approximately 6 milliamps as shown in FIG. 5b. This current surge dissipates power as the energy remaining in the load capacitor C is discharged through the resistance of N channel enhancement mode transistor Q2B of inverter B.

While a specific embodiment of the invention is described above, having selected delays, slew rates and DC drives, other embodiments may also be obtained by controlling the size of the transistors shown in FIG. 4. The size of the transistors may be controlled during the creation of the metal mask for the integrated circuit. In effect, the buffer is "programmed" by the metal mask. This can be done after completion of the entire chip design. In general, the lowest $dV_o/dt$ will be programmed consistent with the system requirements for each output buffer in the circuit.

In an embodiment of this invention, the ratio of the size of transistor Q1A to the sum of the sizes of the transistors Q1A and Q1B is in the range of 20%–60%. The same ratio exists for the size of the transistor Q2A to the sum of the transistors Q2A and Q2B.

FIG. 6 shows a tri-state embodiment of the CMOS output buffer of the present invention. The components in FIG. 6 which are the same as the components in FIG. 4 bear the same labels. Inverters E1 and E2 are identical to inverter E. Control logic 10 of the tri-state CMOS output buffer of FIG. 6 includes input leads EN (enable) and $V_{IN}$, inverters E3 and E4, NOR gate NOR-1 and NAND gate NAND-1.

The input signal on lead EN is provided to NOR gate NOR-1 and the complement $\overline{EN}$ is provided to NAND-1 via inverter E3. The input voltage signal $V_i$ is provided on lead $V_{IN}$ and the complement $\overline{V_i}$ is provided to NOR gate NOR-1 and to NAND gate NAND-1 via inverter E4.

FIG. 7 shows a truth table for control logic 10. When the enable signal EN is high (logical 1), the output signal of NOR gate NOR-1 is a logical 0 and the output signal of NAND gate NAND-1 is a logical 1, regardless of the state of the input voltage signal $V_i$. The logical 0 output signal from NOR gate NOR-1 is inverted by inverters E1 and C so that a logical 1 is applied to the gate of P channel enhancement mode transistor Q1A, and to the gate of P channel enhancement mode transistor Q1B, turning transistors Q1A and Q1B off. The logical 1 output signal from NAND gate NAND-1 is inverted by inverters E2 and D so that a logical 0 is applied to the gates of N channel enhancement mode transistor Q2A and to the gate of N channel enhancement mode transistor Q2B turning transistors Q2A and Q2B off. Transistors Q1A and Q1B are also turned off by the action of inverters E1 and C respectively. Thus, when the enable signal EN is high (logical 1), all of the transistors in inverter A and B are off.

On the other hand, when the enable signal EN is low (logical 0), the output signal of NOR gate NOR-1 and the output signal of NAND gate NAND-1 follow $V_i$, so that the circuit operates as previously explained in conjunction with FIG. 4.

The above embodiments are meant to be explanatory and not limiting. It should be understood that modifications of these embodiments can be made within the scope of the invention.

What is claimed is:

1. A high-speed CMOS output buffer comprising:
   a first circuit network comprising a first control inverter and a first output inverter coupled to the output of said first control inverter;
   a second circuit network comprising a second output inverter coupled in parallel to said first output inverter, a second control inverter and a third control inverter the input of, said second output inverter being coupled to the outputs of said second and third control inverters;
   output means including a load capacitor coupled to the output of said first and second output inverters;
   means for applying an input signal having rising and falling portions to said first, second and third control inverters, so that during the rising portion of said input signal said load capacitor is first charged slowly by said first circuit network and then by said second circuit network and during the falling portion of said input signal, said capacitor is partially discharged slowly by said first circuit network and then fully discharged slowly by said second circuit network, wherein the switching threshold voltage of said first control inverter is less than the switching threshold voltage of said second control inverter and greater than the switching threshold voltage of said third control inverter, the values of said threshold voltages of said control inverters causing each of said output inverters to provide in sequence a partial output of the total output to said load capacitor.

2. A high-speed CMOS output buffer as in claim 1 wherein the switching threshold voltage of said first control inverter and of said first output inverter is approximately 2.5 volts, the threshold voltage of said third control inverter is about 1.1 volts, the threshold voltage of said second control inverter is about 3.7 volts, and wherein a supply voltage of about 5 volts is applied to said first and second output inverters.

3. A high-speed CMOS output buffer as in claim 1 wherein said first and second output inverters and said second and third control inverters each includes a P channel enhancement mode transistor and an N channel enhancement mode transistor.

4. A high-speed CMOS output buffer as in claim 3 wherein the gate width of the P channel transistor of said second control inverter is larger than the gate width of the N channel transistor of said second control inverter.

5. A high-speed CMOS output buffer as in claim 4 wherein the gate width and gate length of said P channel transistor of said second control inverter is about 78 microns and about 2.5 microns respectively, and the gate width and gate length of said N channel transistor of said second control inverter is about 6 microns and 2 microns respectively.

6. A high-speed CMOS output buffer as in claim 3 wherein the P channel transistor of said first output inverter has a channel width of 4×66 microns and a channel length of 3 microns, the N channel transistor of said first output inverter has a channel width of 2×58 microns and a channel length of 2.5 microns; the P channel transistor of said second output inverter has a channel width of 7×66 microns and a channel length of 3 microns, and the N channel transistor of said second output inverter has a channel width of 6×58 microns and a channel length of 2.5 microns.

7. A high-speed CMOS output buffer as in claim 1 wherein said first output inverter comprises first and second transistors, said transistors having gate electrodes connected to each other and having drain electrodes connected to each other, said gate electrodes being connected to the output of said first control inverter;

said second control inverter having third and fourth transistors, said third and fourth transistors having gate electrodes connected to each other, and having drain electrodes connected to each other;

said third control inverter comprising fifth and sixth transistors, said fifth and sixth transistors having their gates connected to each other and to the gates of said third and fourth transistors, said fifth and sixth transistors having their drain electrodes connected to each other;

said second output inverter comprising seventh and eighth transistors, said seventh transistor having its gate electrode connected to the drain electrodes of said third and fourth transistors and said eighth transistor having its gate electrode connected to the drain electrodes of said fifth and sixth transistors;

the drain electrodes of said seventh and eighth transistors being connected together and to the drain electrodes of said first and second transistors, said drain electrodes of said first, second, seventh and eighth transistors being coupled to said load capacitor;

said transistors having source electrodes coupled to voltage supplies.

8. A high-speed CMOS output buffer as in claim 7, wherein the ratio of the size of the first transistor to the sum of the sizes of said first transistor and said seventh transistor is in the range of 20%–60%, and the ratio of the size of the second transistor to the sum of the sizes of said second transistor and said eighth transistor is in the range of 20%–60%.

9. A method for operating a high-speed CMOS output buffer having a first circuit network including a first control inverter and a first output inverter coupled to the output of said first control inverter, a second circuit network including second and third control inverters and a second output inverter coupled to the outputs of said second and third control inverters, and a load capacitor coupled to the output of said first and second output inverters, comprising the steps of:

applying a rising voltage input signal simultaneously to the inputs of said control inverters so that first said third control inverter goes low, then said first control inverter goes low, whereby the output signal of said first output inverter goes high and a first transient current surge charges said load capacitor, followed by said second control inverter going low and a second transient current surge charges the load capacitor; and applying a falling voltage input signal to said control inverters so that first said second control inverter goes high, then said first control inverter goes high whereby the output signal of said first output inverter goes low and a third current surge partially discharges the load capacitor, followed by said third control inverter going high and a fourth current surge fully discharges said load capacitor, so that noise generated by said load capacitor during charge and discharge is minimized.

* * * * *